United States Patent
Lee et al.

(10) Patent No.: US 7,939,841 B2
(45) Date of Patent: May 10, 2011

(54) HIGH OUTPUT LIGHT EMITTING DIODE AND METHOD FOR FABRICATING THE SAME

(75) Inventors: Hyun Jae Lee, Yongin-si (KR); Jun Seok Ha, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/318,505

(22) Filed: Dec. 28, 2005

(65) Prior Publication Data

US 2006/0145174 A1 Jul. 6, 2006

(30) Foreign Application Priority Data

Dec. 31, 2004 (KR) .................. 10-2004-0117766

(51) Int. Cl.
*H01L 33/00* (2010.01)
(52) U.S. Cl. ................. 257/98; 257/E33.068
(58) Field of Classification Search ........... 257/79–103, 257/E33.068
See application file for complete search history.

(56) References Cited

U.S. PATENT DOCUMENTS

| | | | | |
|---|---|---|---|---|
| 5,714,014 A | * | 2/1998 | Horikawa | 148/33 |
| 5,779,924 A | * | 7/1998 | Krames et al. | 216/24 |
| 6,229,160 B1 | * | 5/2001 | Krames et al. | 257/94 |
| 2001/0000209 A1 | | 4/2001 | Krames et al. | |
| 2003/0205712 A1 | * | 11/2003 | Bhat et al. | 257/79 |

FOREIGN PATENT DOCUMENTS

| | | |
|---|---|---|
| EP | 1256987 A2 | 11/2002 |
| GB | 2311413 A | 9/1997 |
| JP | 64-076786 | 3/1989 |
| JP | 4-212480 | 8/1992 |
| JP | 5-145118 | 6/1993 |
| JP | 06-005912 * | 1/1994 |
| JP | 6-45650 | 2/1994 |
| JP | 7-307489 | 11/1995 |
| JP | 2002-043633 | 2/2002 |
| JP | 2002-344015 | 11/2002 |
| JP | 2004-056010 | 2/2004 |
| JP | 2004-56034 | 2/2004 |
| JP | 6-252440 | 9/2004 |
| WO | WO 2004-070844 A1 | 8/2004 |

OTHER PUBLICATIONS

Machine Translation of JP-6-252440 (6 pages).*
S. Illek et al., "Scalability of Buried Micro-Reflector Light Emitting Diodes for High-Current Applications," Light-Emitting Diodes: Research Manufacturing, and Applications VII, Jan. 27-29, 2003, San Jose, CA, vol. 4996, Jan. 27, 2003, pp. 18-25.
Wolfgang Schmid, et al., "High-Efficiency Red and Infrared Light-Emitting Diodes Using Radial Outcoupling Taper," IEEE Journal of Selected Topics in Quantum Electronics, IEEE Service Center Piscataway, NJ, US, vol. 8, No. 2, Mar. 2002, p. 256-263.

* cited by examiner

*Primary Examiner* — Bradley K Smith
(74) *Attorney, Agent, or Firm* — McKenna Long & Aldridge LLP

(57) ABSTRACT

A high output light emitting diode (LED) and a method for fabricating the LED is disclosed. The LED includes a sidewall or surface that is inclined. A reflective film is formed on the inclined sidewall or surface to allow light to reflect from the reflective film and to emit the light upward or in a favorable direction with respect to the device, thereby being configured and enabled to improve a light output of the LED and dispense with an additional passivation process.

7 Claims, 10 Drawing Sheets

FIG. 1

PRIOR ART

FIG. 2

PRIOR ART

HIGH OUTPUT LIGHT EMITTING DIODE AND METHOD FOR FABRICATING THE SAME

This application claims the benefit of Korean Patent Application No. 2004-0117766, filed on Dec. 31, 2004, which is hereby incorporated by reference for all purposes as if fully set forth herein.

BACKGROUND OF THE INVENTION

1. Field of the Invention

The present invention relates to a high output light emitting diode (LED) and a method for fabricating the same wherein a sidewall of the LED is inclined and a reflective film is formed on the inclined sidewall to allow light emitted outside of the sidewall to reflect from the reflective film and to emit upward of the device, thereby enabling to improve a light output and dispensing with an additional passivation process.

2. Discussion of the Related Art

Generally, an LED is widely used in applied fields such as color bulletin boards, traffic lights, keypad light sources for mobile telephones, light sources for illumination and LCD backlights.

Figure 1:
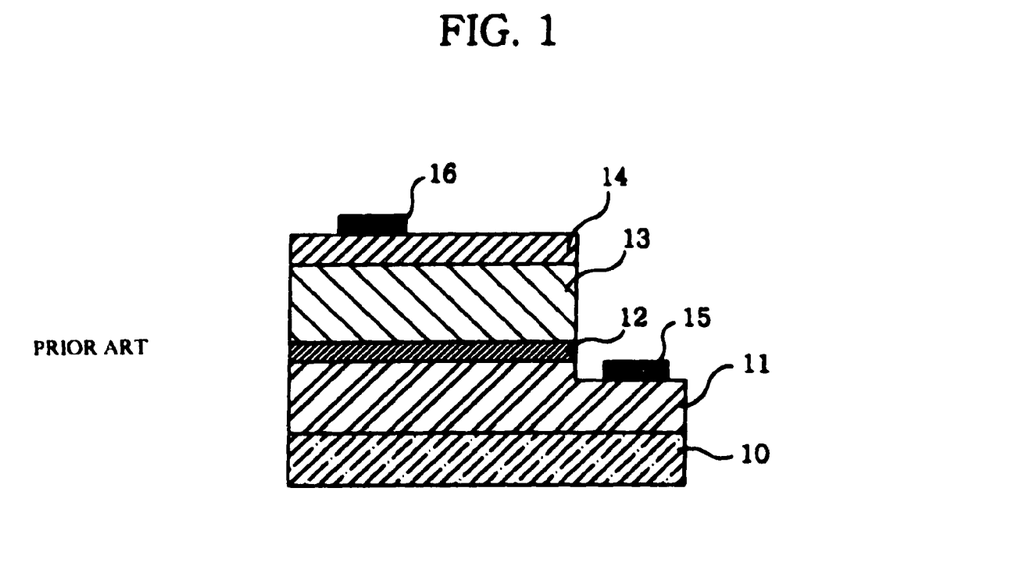
FIG. 1 is a cross-sectional view of an LED according to the prior art.

FIG. 1 is a cross-sectional view of a conventional LED. The LED includes a substrate (10) sequentially stacked thereon with an N-type semiconductor layer (11), an active layer (12) and a P-type semiconductor layer (13), mesa etched from the P-type semiconductor layer (13) to portions of the N-type semiconductor layer (11), a transparent electrode (14) formed on the P-type semiconductor layer (13), an N electrode (15) formed on the mesa-etched N-type semiconductor layer (11) and a P electrode (16) formed on the transparent electrode (14).

If current flows in the N electrode (15) and the P electrode (16) in the LED, light is generated from the active layer (12) and emitted outside of the device. Many attempts have been made to increase the light output of the LED, and a device manufacturing of flip chip structure is one of the attempts.

Figure 2:
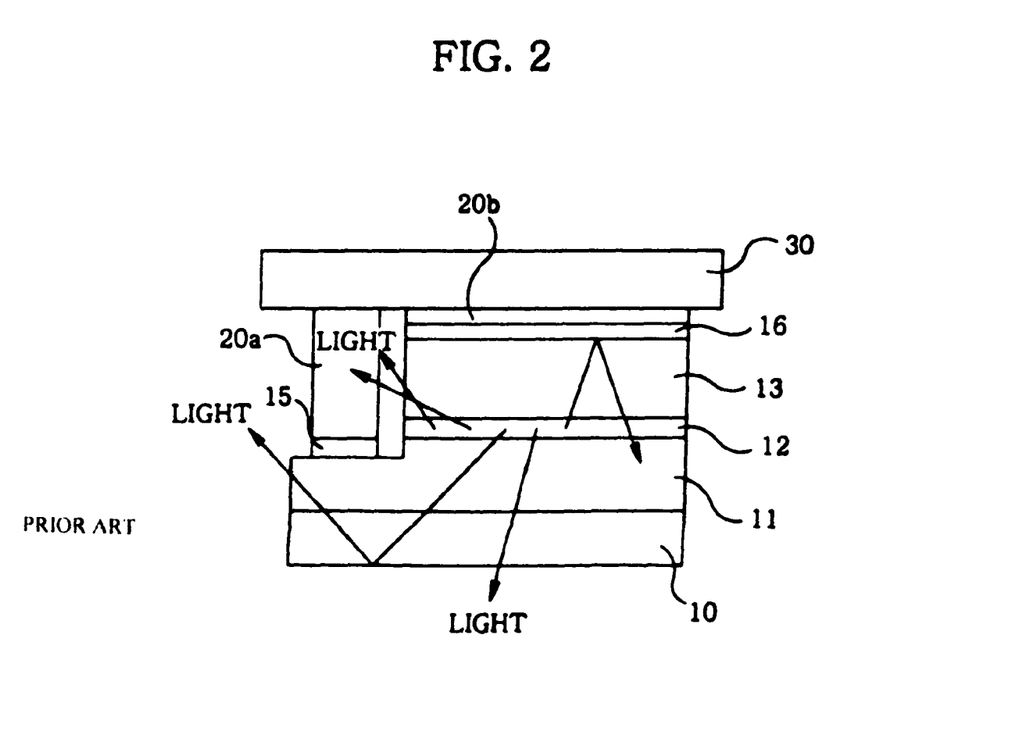
FIG. 2 is a mimetic cross-sectional view of a flip chip LED bonded to a sub mount substrate according to the prior art.

FIG. 2 is a mimetic cross-sectional view of a flip chip LED bonded to a sub mount substrate according to the prior art. Referring to the LED structure of FIG. 1, the flip chip LED is structured in such a manner that the P-type semiconductor layer (13) is stacked thereon with a reflective film (16) for P electrode, the reflective film (16) and the N electrode (15) are bonded to a sub mount substrate (30) by conductive bonding materials such as solders (20a. 20b), and light is emitted toward the substrate (10).

In other words, the flip chip type light device is such that the light emitted from the active layer (12) is reflected from the reflective film (16) to be emitted outside of the device via the substrate (10).

However, the light emitted from the flip chip type light device is reflected from an entire surface of the device to the disadvantage of wasting the light emitted from the sidewall of the device.

Particularly, in the case of a cleavage plane of the device, part of light emitted from a sidewall of the device is reflected from the cleavage plane, confined inside the device and cannot be emitted therefrom, thereby resulting in decreased light emission from the device.

SUMMARY OF THE INVENTION

The present invention is directed to solve the afore-mentioned problems, and it is an object of the invention to provide a high output LED and a method for fabricating the same wherein a sidewall of the LED is inclined and a reflective film is formed on the inclined sidewall to allow light emitted outside of the sidewall to reflect from the reflective film and to emit upward of the device, thereby enabling to improve a light output and dispensing with an additional passivation process.

Another object of the invention is to form a curvature on a sidewall of a light emitting structure to increase a light emitting area and to improve a light output.

Still another object is to create a cylindrical LED and to uniformly pass current, thereby enabling light emitted from a light emitting surface to be outputted in a uniform strength.

In a first aspect of the invention, a high output LED comprising a structure sequentially stacked with an N-type semiconductor layer, an active layer and a P-type semiconductor layer to allow the light emitted from the active layer, is formed in such a manner that a front surface of a sidewall of the structure stacked with the N-type semiconductor layer, the active layer and the P-type semiconductor layer is inclined, and a reflective film is formed at an entire inclined sidewall for reflecting light emitted from the active layer.

In a second aspect of the invention, a high output LED is formed in such a manner that a substrate is sequentially stacked thereon with an N-type semiconductor layer, an active layer and a P-type semiconductor layer, mesa-etching is performed from the P-type semiconductor layer to portions of the N-type semiconductor layer, a mesa-etched sidewall and sidewalls of the P-type semiconductor layer, the active layer and N-type semiconductor layer are all inclined, the inclined sidewalls are formed with a reflective film, an N electrode is formed on the mesa-etched N-type semiconductor layer, and a P electrode is formed on the P-type semiconductor layer.

In a third aspect of the invention, a high output LED is formed in such a manner that an active layer and a N-type semiconductor layer are sequentially stacked on a P-type semiconductor layer, sidewalls of the P-type semiconductor layer, the active layer and the N-type semiconductor layer are inclined, the inclined sidewalls are formed with reflective films, and the N-type semiconductor layer is formed thereon with an N electrode.

In a fourth aspect of the invention, a method for fabricating a high output LED comprising: sequentially stacking an N-type semiconductor layer, an active layer and a P-type semiconductor layer on a substrate; mesa-etching in such a manner that mesa-etched sidewalls from the P-type semiconductor layer to portions of the N-type semiconductor layer are inclined; etching the remaining sidewalls of the N-type semiconductor, the active layer and the P-type semiconductor layer except for the mesa-etched portions to form inclined sidewalls; evaporating reflective films on the inclined sidewalls; and forming an N electrode on the mesa-etched N-type semiconductor layer, and forming a P electrode on the P-type semiconductor layer.

In a fifth aspect of the invention, a method for fabricating a high output LED comprising: sequentially stacking an N-type semiconductor layer, an active layer and a P-type semiconductor layer on a substrate; etching from the P-type semiconductor layer to portions of the N-type semiconductor layer and forming an inclination on the etched sidewalls; detaching the substrate from the N-type semiconductor layer; forming a reflecting P electrode underneath the P-type semiconductor layer; and forming a reflective film on the inclined sidewalls and forming an N electrode on the N-type semiconductor layer.

In a sixth aspect of the invention, a method for fabricating a high output LED comprising: sequentially stacking an N-type semiconductor layer, an active layer and a P-type semiconductor layer on a substrate; forming a mask layer formed with a curvature on a sidewall on an upper surface of the P-type semiconductor layer; masking the P-type semiconductor by the masking layer and etching from the P-type semiconductor layer to the N-type semiconductor layer to form an inclination and indents on the etched sidewalls; detaching the substrate from the N-type semiconductor layer; forming a reflecting P electrode underneath the P-type semiconductor layer; and forming a reflective film on the inclined sidewalls; and forming an N electrode on the N-type semiconductor layer.

In a seventh aspect of the invention, a method for fabricating a high output LED comprising: sequentially stacking an N-type semiconductor layer, an active layer and a P-type semiconductor layer on a substrate; forming on the P-type semiconductor layer a plurality of disc-shaped mask layers, each mask layer spaced a predetermined distance apart; masking the P-type semiconductor layer by the plurality of mask layers and etching from the P-type semiconductor layer to the N-type semiconductor layer to form an inclination on the etched sidewalls; detaching the substrate from the N-type semiconductor layer to obtain a plurality of light emitting structures on which a P-type semiconductor layer, an active layer and an N-type semiconductor layer are stacked; forming reflective films on each sidewall of the light emitting structures; forming N electrodes underneath each N-type semiconductor layer of the light emitting structures; and forming P electrodes on each P-type semiconductor layer of the light emitting structures.

DETAILED DESCRIPTION OF THE PREFERRED EMBODIMENTS

FIGS. 3a through 3e are cross-sectional views explaining a fabricating process of a high output LED according to a first embodiment of the present.

Figure 3A:
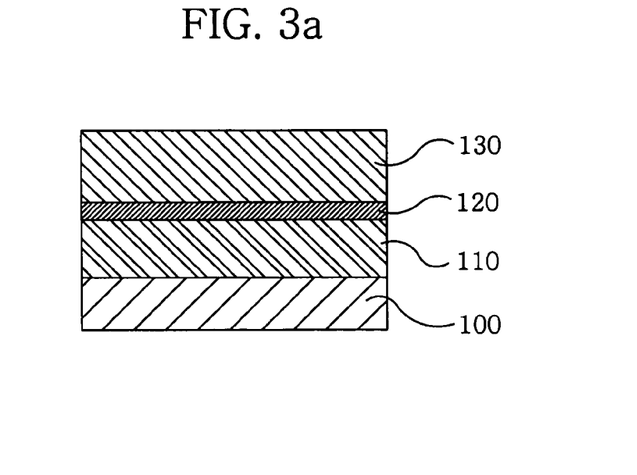
FIGS. 3a, 3b, 3c, 3d, and 3e are cross-sectional views illustrating and explaining a fabricating process of a high output LED according to a first embodiment of the present.
Figure 3B:
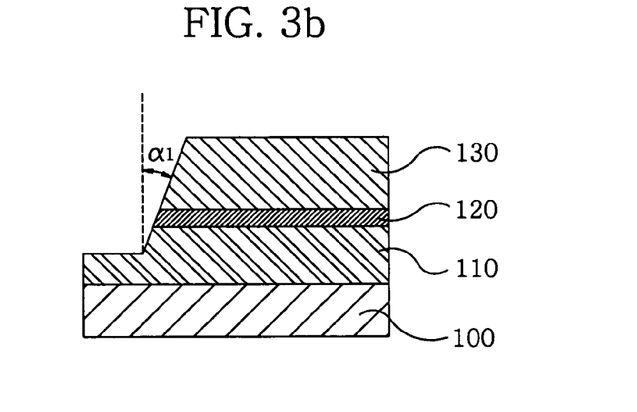

A substrate (100) is sequentially stacked thereon with an N-type semiconductor layer (110), an active layer (120), and a P-type semiconductor layer (130) (FIG. 3a), and mesa-etching is carried out from the P-type semiconductor layer (130) to portions of the N-type semiconductor layer (110) so that the sidewall thereof is inclined (FIG. 3b).

In other words, in the process of FIG. 3b, the sidewall is etched at a predetermined angle ($\alpha 1$).

In order to etch the sidewall having an inclination, a mask layer is formed on the upper surface of the P-type semiconductor (130) except for a region to be etched, and the P-type semiconductor (130) is masked by the mask layer and dry-etched to obtain an inclined sidewall.

Figure 3C:
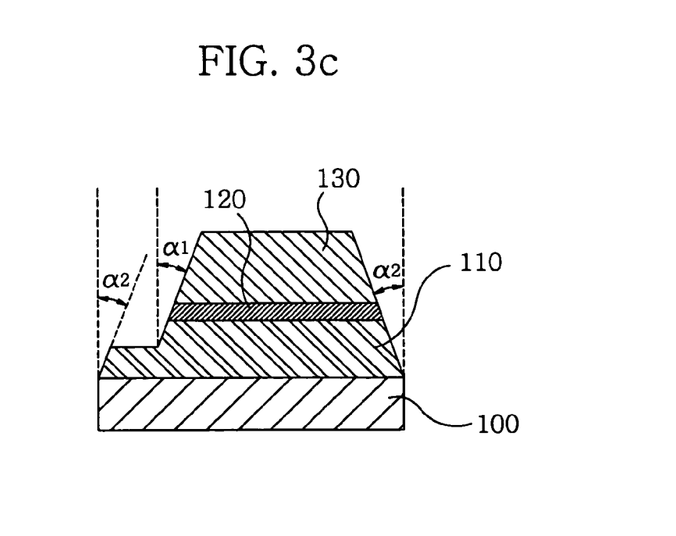

Successively, remaining sidewall of the N-type semiconductor layer (110), the active layer (120) and the P-type semiconductor layer (130) except for the mesa-etched region is etched to form an inclined sidewall (FIG. 3c).

At this time, the inclined angle ($\alpha 2$) of the remaining sidewall may be the same as the angle ($\alpha 1$) of the mesa-etched sidewall, or may be different. Preferably, the inclined angles ($\alpha 1$ and $\alpha 2$) are in the range of 30~70 degrees.

Figure 3D:
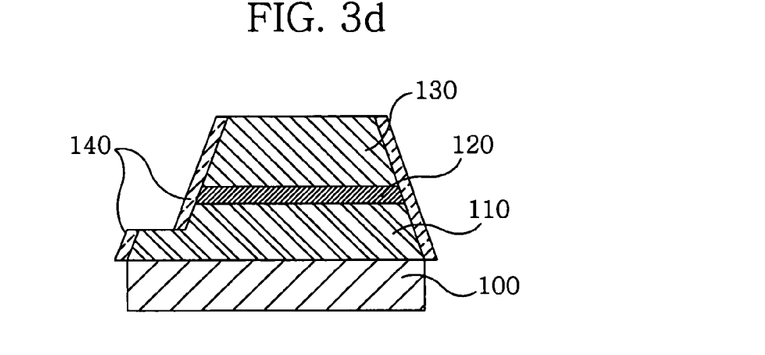

Then, the inclined sidewall is evaporated with a reflective film (140) (FIG. 3d). The inclined sidewall facilitates the evaporation of the reflective film (140). Preferably, the reflective film (140) is an anti-reflection (AR) film, a film stacked with reflective layers, or a high reflection (HR) film.

The HR film is an insulating film having high reflection, and serves per se to reflect the light emitted from a sidewall of an LED and functions to passivate the device as well.

Furthermore, the AR film per se is an insulating film having a high transmission factor. Although the AR film does not act as a reflective film, it functions as an excellent reflective material and serves to protect the device if formed with a reflective film at an external side thereof because it has a high optical transmission factor.

Preferably, the reflective film is made of metal such as Ag or Al.

Figure 3E:
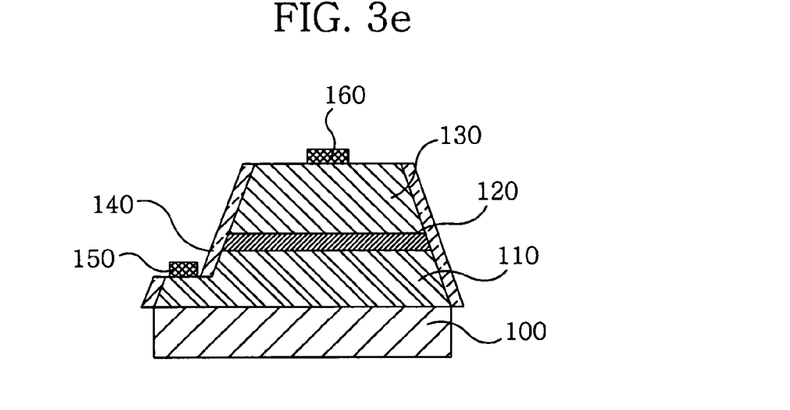

As a last step, the N electrode (150) is formed on the mesa-etched N-type semiconductor layer (110) and the P electrode (160) is formed on the P-type semiconductor layer (FIG. 3e). As illustrated in FIG. 3e, the afore-mentioned process enables to fabricate an LED according to the first embodiment of the present invention.

Figure 4:
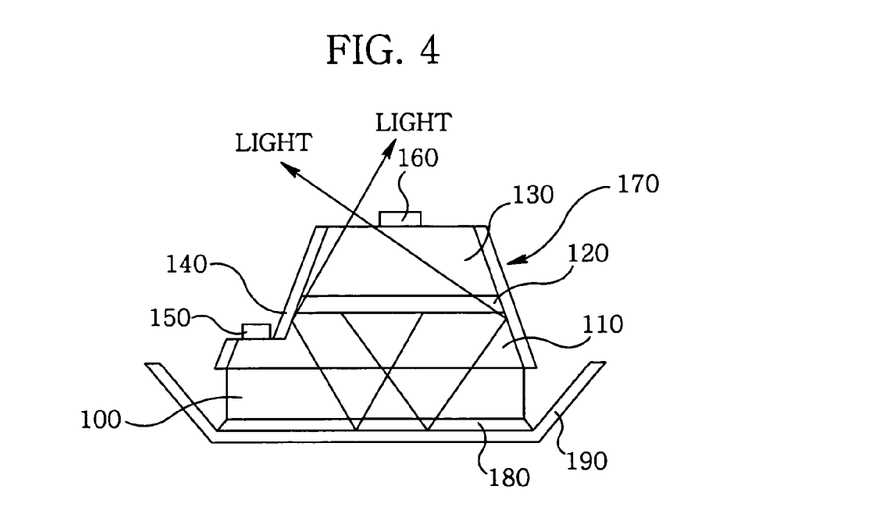
FIG. 4 is a mimetic cross-sectional view illustrating and explaining a state where the high output LED according to the first embodiment of the present invention is bonded to a reflective plate to emit light.

FIG. 4 is a mimetic cross-sectional view illustrating and explaining a state where the high output LED according to the first embodiment of the present invention is bonded to a reflective plate to emit light.

The high output LED according to the first embodiment of the present invention fabricated via the processes from FIG. 3a through 3e, the high output LED is formed in such a manner that a substrate (100) is sequentially stacked thereon with an N-type semiconductor layer (110), an active layer (120) and a P-type semiconductor layer (130), mesa-etching is performed from the P-type semiconductor layer (130) to portions of the N-type semiconductor layer (110), a mesa-etched sidewall and sidewalls of the P-type semiconductor layer (130), the active layer (120) and N-type semiconductor layer (110) are all inclined, the inclined sidewalls are formed with a reflective film (140), an N electrode (150) is formed on the mesa-etched N-type semiconductor layer (110), and a P electrode (160) is formed on the P-type semiconductor layer (130).

The LED (170) thus fabricated is bonded to an upper surface of a reflective plate (190) by bonding material (180). The light emitted from the active layer (120) is reflected by the reflective film (140) formed at a sidewall of the LED to be emitted upward of the P-type semiconductor layer (130) of the device. Consequently, the light is not irradiated to the sidewall but advances straight to the upward of the device, enabling to improve the light output.

FIGS. 5a through 5e are cross-sectional views illustrating a fabricating process of a high output LED according to a second embodiment of the present invention.

Figure 5A:
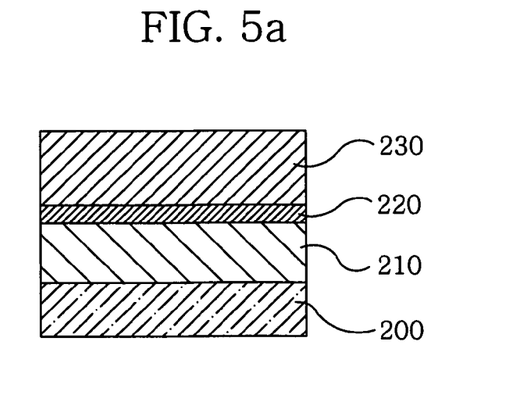
FIGS. 5a, 5b, 5c, 5d and 5e are cross-sectional views illustrating and explaining a fabricating process of a high output LED according to a second embodiment of the present invention.
Figure 5B:
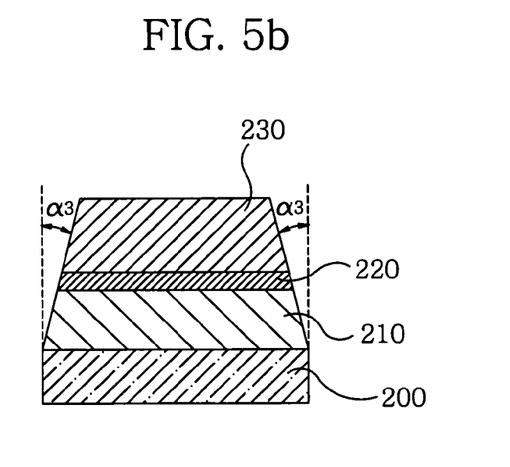
Figure 5C:
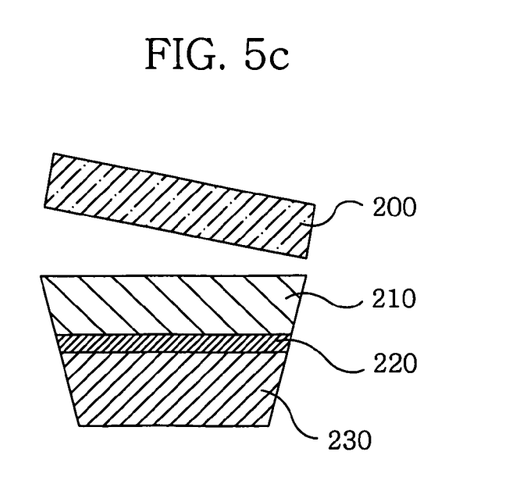
Figure 5D:
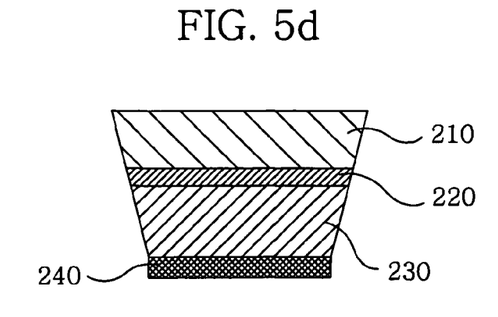
Figure 5E:
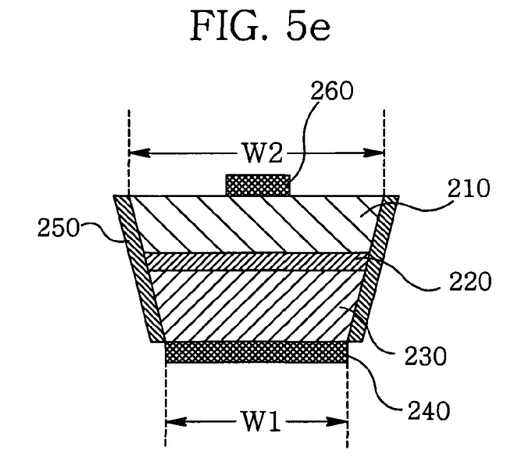

A substrate (200) is sequentially stacked with an N-type semiconductor layer (210), an active layer (220) and a P-type semiconductor layer (230) (FIG. 5a). Etching is carried out from the P-type semiconductor layer (230) to the N-type semiconductor layer (210) to form an etched sidewall (FIG. 5b). The etched sidewall has a predetermined angle ($\alpha 3$). The substrate (200) is detached from the N-type semiconductor layer (210) (FIG. 5c). Successively, the P-type semiconductor layer (230) is formed thereunder with a reflecting P electrode (240) (FIG. 5d). The inclined sidewall is formed with a reflective film (250) and the N-type semiconductor layer (210) is formed thereon with an N electrode (260) (FIG. 5e). Preferably, a width (W1) of the P-type semiconductor layer (230) is smaller than a width (W2) of the N-type semiconductor layer (210).

Figure 6:
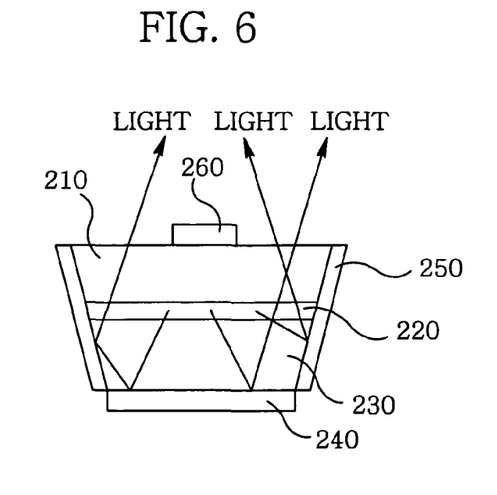
FIG. 6 is a mimetic cross-sectional view illustrating and explaining a state where light is emitted from the high output LED according to the second embodiment of the present invention.

FIG. 6 is a mimetic cross-sectional view explaining a state where light is emitted from the high output LED according to the second embodiment of the present invention.

The high output LED according to the second embodiment of the present invention fabricated by the process illustrated in FIGS. 5a through 5e is formed in such a manner that a P-type semiconductor layer (230) is sequentially stacked thereon with an active layer (220) and an N-type semiconductor layer, sidewalls of the P-type semiconductor layer (230), the active layer (220) and the N-type semiconductor layer are inclined, the inclined sidewalls are formed with a reflective film (250), the P-type semiconductor layer (230) is formed thereunder with a reflective P electrode (240) and the N-type semiconductor layer is formed thereon with an N electrode.

In the LED thus constructed, the light emitted from the active layer (220) is reflected from the reflective film (250) formed on a sidewall of the LED and the reflective N electrode (240) and emitted to the outside of the N-type semiconductor layer (210) on the device.

Consequently, the light is not emitted to the sidewall in the LED of the second embodiment of the present invention, and the light advances straight and is emitted upward of the device, enabling to improve the light output.

Figure 7A:
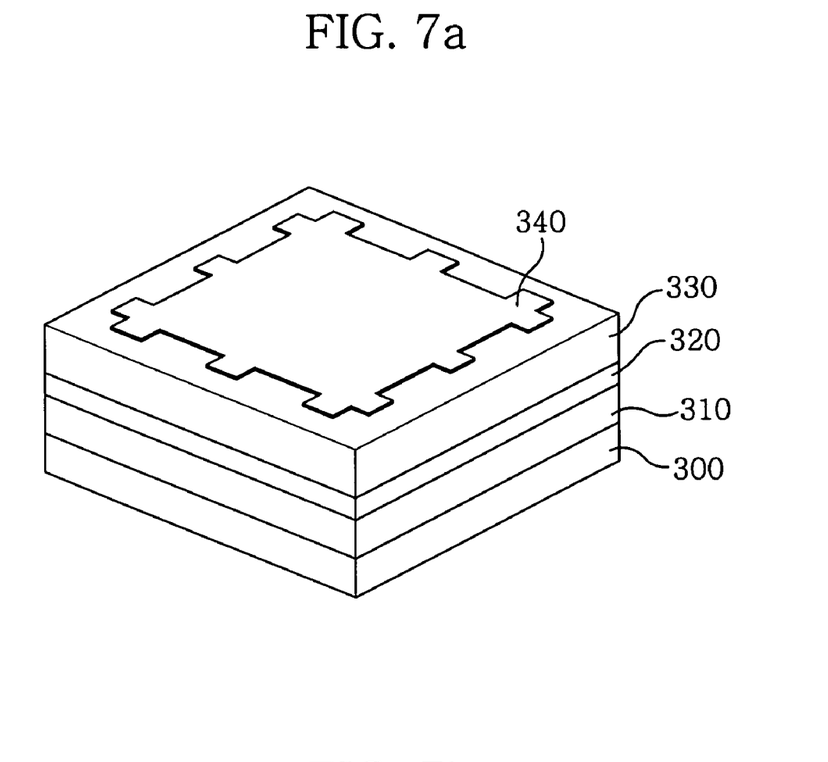
FIGS. 7a and 7b are perspective views explaining a fabricating process of a high output LED according to a third embodiment of the present invention.
Figure 7B:
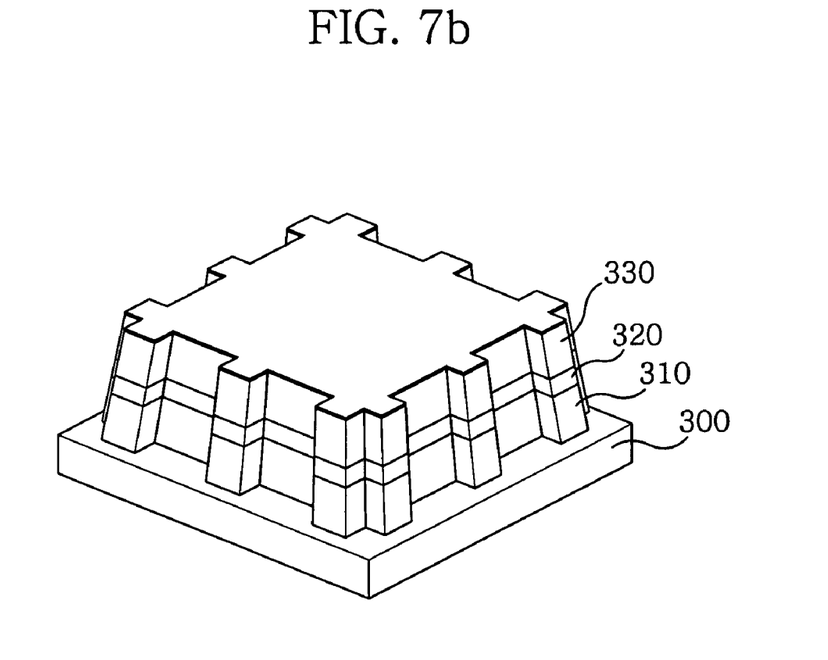

FIGS. 7a and 7b are perspective views explaining a fabricating process of a high output LED according to a third embodiment of the present invention.

A substrate (300) is sequentially stacked thereon with a N-type semiconductor layer (310), an active layer (320) and a P-type semiconductor layer (330), and the P-type semiconductor layer (330) is formed thereon with a mask layer (340) formed at a sidewall thereof with indents (341) (FIG. 7a).

The P-type semiconductor layer (330) is masked by the mask layer (340), and etching is carried out from the P-type semiconductor layer (330) to the N-type semiconductor layer (310). The etched sidewall is formed with inclinations and indents (FIG. 7b).

Successively, the substrate (300) is detached from the N-type semiconductor layer (310). The reflective P electrode is formed under or underneath the P-type semiconductor layer (330). The inclined sidewall is formed with a reflective film and N electrode is formed on the N-type semiconductor layer (310).

There is an advantage in the high output LED thus fabricated according to the third embodiment of the present invention in that the inclined sidewall is formed with indents to increase a light emitting area and a light output.

In other words, the sidewall of the light emitting structure is formed with indents to allow the sidewall of the active layer to be also formed with indents, thereby increasing the light emitting area.

Figure 8A:
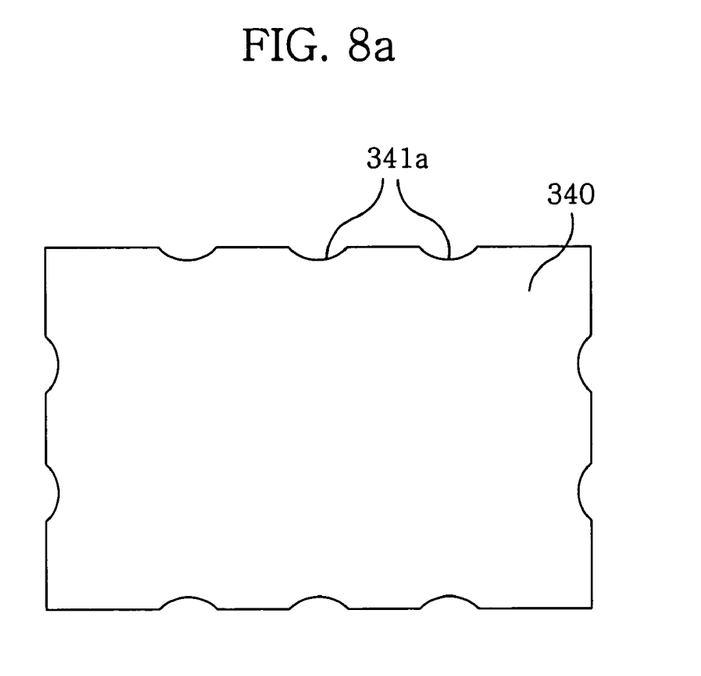
FIGS. 8a and 8b are plan views of examples of mask layers according to the third embodiment of the present invention.
Figure 8B:
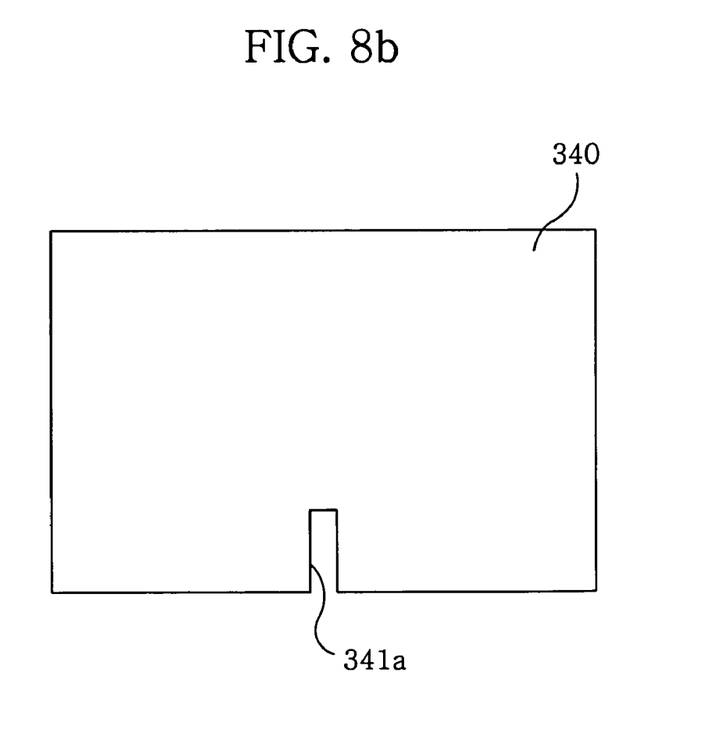

FIGS. 8a and 8b are plan views of an example of a mask layer according to aspects relating to a third embodiment of the present invention.

Referring to FIG. 8a, the mask layer is a square layer or a layer whose margin is interjected with removed regions each spaced at a predetermined distance apart. Referring to FIG. 8b, the mask layer is a square layer or a layer, one margin of which is removed of a region.

The mask layer may be multi-angled, or formed at a marginal sidewall thereof with indents combined of plain or curved surfaces. The indents of the sidewalls of the LED formed by use of the mask may be formed with plain surface and curved surface.

Figure 9A:
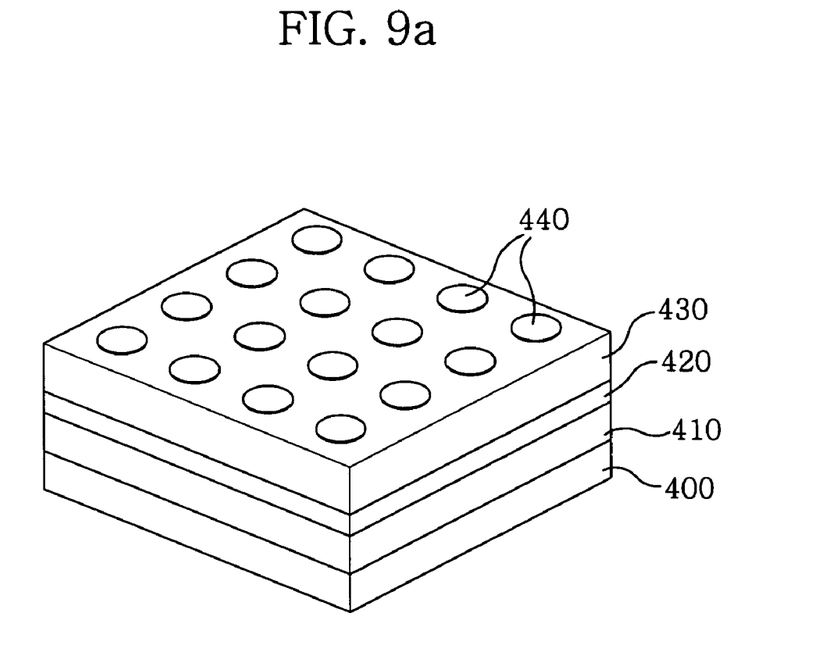
FIGS. 9a and 9b are perspective views explaining a fabricating process of a high output LED according to a fourth embodiment of the present invention.
Figure 9B:
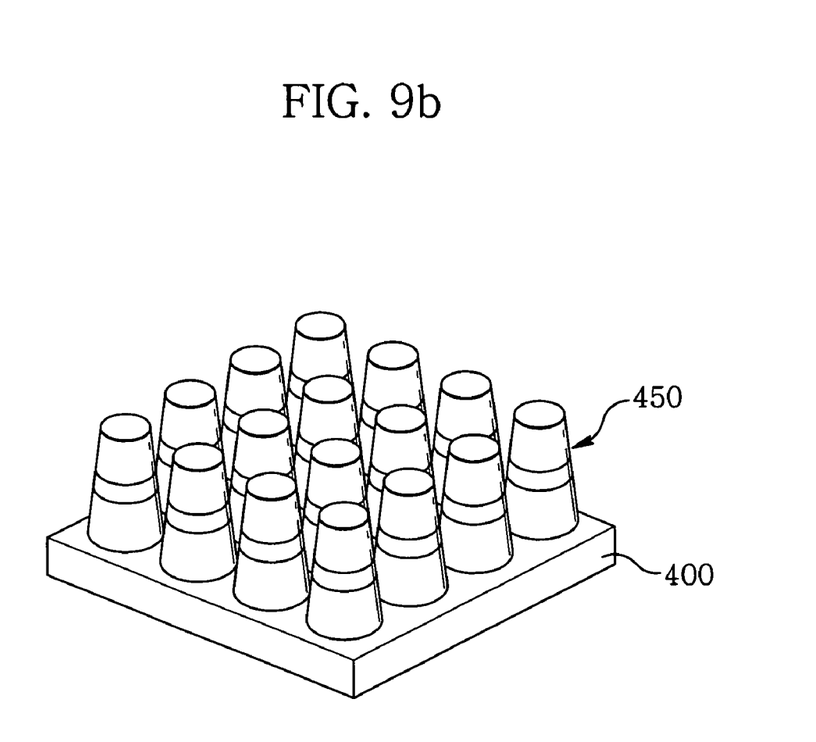

FIGS. 9a and 9b are perspective views explaining a fabricating process of a high output LED according to a fourth embodiment of the present invention.

A substrate (400) is sequentially stacked with a N-type semiconductor layer (410), an active layer (420) and a P-type semiconductor layer (430). The P-type semiconductor layer (430) is formed thereon with a plurality of disc-shaped mask layers (440) each spaced a predetermined distance apart (FIG. 9a).

Successively, the P-type semiconductor layer (430) is masked by the mask layer (440) and etching is executed from the P-type semiconductor layer (430) to the N-type semiconductor layer (410). The etched sidewall is formed with an inclination (FIG. 9b).

By the process thus described according to FIG. 9b, the substrate (400) may be formed thereon with a plurality of cylindrical light emitting structures, each structure having a wider lower portion and a smaller upper portion.

Figure 10A:
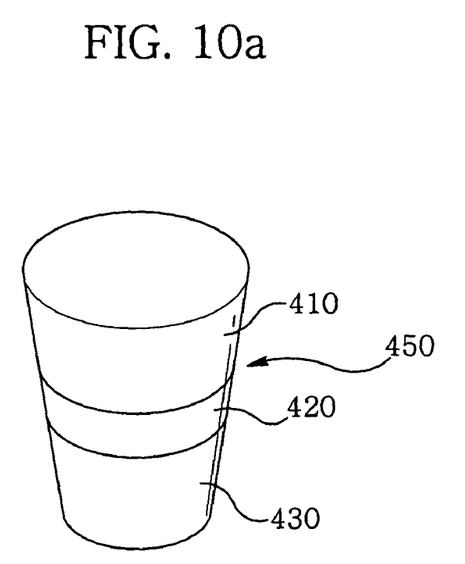
FIGS. 10a and 10b are perspective views explaining a process of forming an electrode and a reflective film on each LED according to the fourth embodiment of the present invention.
Figure 10B:
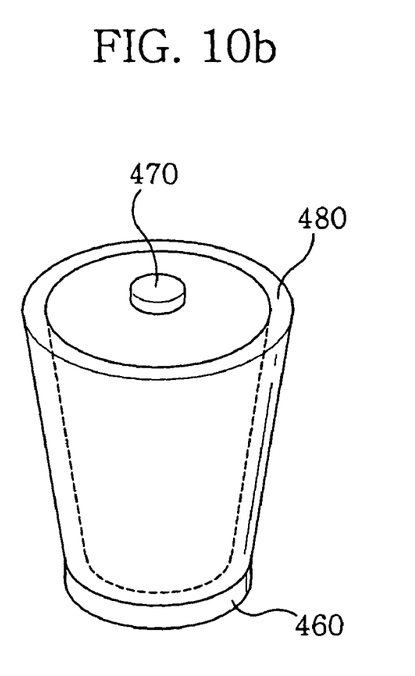

FIGS. 10a and 10b are perspective views explaining a process of forming an electrode and a reflective film on each LED according to the fourth embodiment of the present invention.

Following the process of FIG. 9b, the substrate (400) is detached from the N-type semiconductor layer (410), and reversely positioned to obtain a light emitting structure (450) stacked with the P-type semiconductor layer (430), the active layer (420) and the N-type semiconductor layer (410) as illustrated in FIG. 10a.

The light emitting structure (450) has a cylindrical shape where a diameter of the P-type semiconductor layer (430) is smaller than that of the N-type semiconductor layer (410).

Now, referring to FIG. 10b, a sidewall of the light emitting structure (450) is formed with a reflective film (480). A lower portion of the P-type semiconductor layer (460) is formed with a P electrode (460) and an upper portion of the N-type semiconductor layer (410) is formed with an N electrode (470).

This process completes a fabrication of a cylindrical LED. The cylindrical LED can allow the current to flow uniformly to make the light strength on a light emitting surface even such that color sensitivity becomes excellent when an LED is applied to a light source and a display.

Figure 11A:
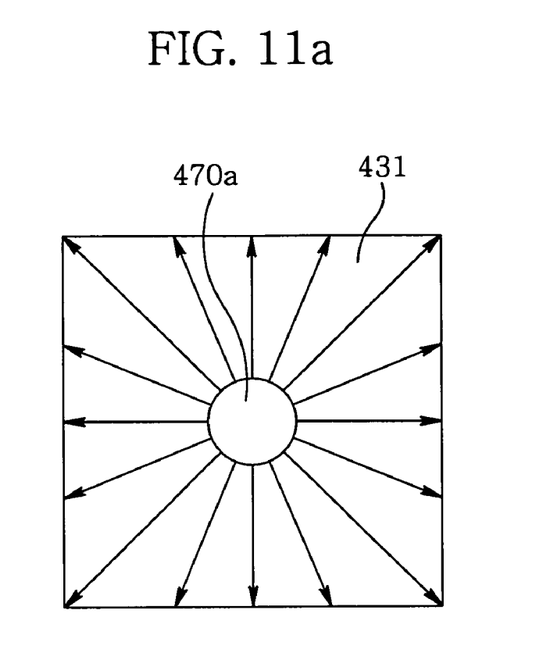
FIGS. 11a and 11b are schematic comparative diagrams in which a current flows in an LED having a square upper surface and an LED having a round upper surface according to the fourth embodiment of the present invention.
Figure 11B:
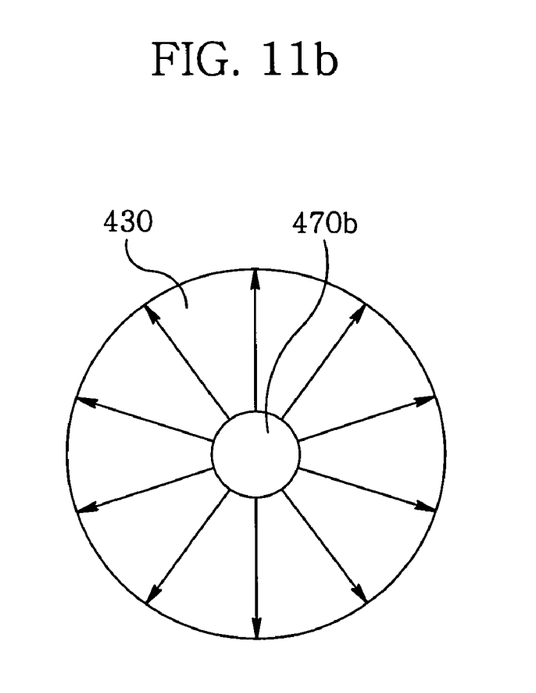

FIGS. 11a and 11b are schematic comparative diagrams in which a current flows in an LED having a square upper surface and an LED having a round upper surface according to aspects relating to the fourth embodiment of the present invention.

An LED having a square upper surface as shown in FIG. 11a allows each distance of a current reaching from the P electrode (470a) to a margin of the P-type semiconductor layer (431) to differ, resulting in an uneven light strength. Meanwhile, an LED having a round upper surface as illustrated in FIG. 11b allows each distance of a current reaching from the P electrode to a margin of the P-type semiconductor layer (430) to be identical, resulting in an even light strength.

Consequently, the LED according to the fourth embodiment of the present invention enables the light strength from a light emitting surface to be even.

As apparent from the foregoing, there is an advantage in the preferred embodiments of the present invention thus described in that a sidewall of an LED is inclined and a reflective film is formed on the inclined sidewall to allow light emitted outside of the sidewall to reflect from the reflective film and to emit upward of the device, thereby enabling to improve a light output and dispensing with an additional passivation process.

Another advantage is that indents are formed on a sidewall of a light emitting structure to thereby increase a light emitting surface and to improve a light output.

Still another advantage is that a cylindrical LED is embodied to allow light from a light emitting surface to be emitted in an even strength by flowing current uniformly.

The present invention has been described above in varied detail by reference to particular exemplary embodiments and figures. Those skilled in the art will readily observe that numerous modifications and alterations of the invention may be made while retaining the teachings of the invention. Accordingly, the above disclosure should be construed as limited only by the metes and bounds of appended claims.

What is claimed is:

1. A light emitting device having a vertical topology structure comprising:
a light emitting diode (LED) structure having a first surface, a second surface, inclined sidewalls and a first side surface, a second side surface, a third side surface, and a fourth side surface, the LED structure comprising a first-type semiconductor layer, an active layer and a second-type semiconductor layer, wherein the inclined sidewalls have grooves continuously and straightly extended along said sidewalls of said layers and are configured to increase the total light emitting area thereof, wherein grooves are respectively formed on the first side, the second side, the third side, and the fourth side surfaces, and each groove has substantially the same depth;
a first electrode over the first surface of the LED structure;
a second electrode over the second surface of the LED structure, wherein the first electrode and second electrode are located over the opposite surfaces of the LED structure, respectively;
a reflective film disposed over the inclined sidewalls of the LED structure, the reflective film comprising an anti-reflection layer and a reflection layer, wherein the reflective film is configured to reflect light emitted from the active layer generally back through the first surface of the LED structure and also configured to serve as a passivation layer.

2. The light emitting device as defined in claim 1, wherein each of the inclined sidewalls defines an angle having a range of 30-70 degrees.

3. The light emitting device as defined in claim 1, wherein each of the inclined sidewalls has substantially the same inclination angle.

4. The light emitting device as defined in claim 1, wherein the grooves comprise a planar portion and/or a curved portion.

5. The light emitting device as defined in claim 1, wherein a horizontal cross-sectional area of the first semiconductor layer is greater than that of the second semiconductor layer.

6. The light emitting device as defined in claim 1, wherein each of the inclined sidewalls has a reversed slope.

7. The light emitting device as defined in claim 1, wherein the grooves are formed by a partially removed portion of the LED structure.

* * * * *